(12) United States Patent
Eguchi et al.

(10) Patent No.: US 9,954,148 B2
(45) Date of Patent: Apr. 24, 2018

(54) LIGHT-EMITTING APPARATUS WITH OPTICAL ELEMENT AND METHOD OF MANUFACTURING THE SAME

(71) Applicants: CITIZEN ELECTRONICS CO., LTD., Fujiyoshida-shi, Yamanashi (JP); CITIZEN WATCH CO., LTD., Nishitokyo-shi, Tokyo (JP)

(72) Inventors: Hiroaki Eguchi, Sagamihara (JP); Sadato Imai, Yamanashi (JP)

(73) Assignees: CITIZEN ELECTRONICS CO., LTD., Yamanashi (JP); CITIZEN WATCH CO., LTD., Tokyo (JP)

(*) Notice: Subject to any disclaimer, the term of this patent is extended or adjusted under 35 U.S.C. 154(b) by 277 days.

(21) Appl. No.: 14/920,353

(22) Filed: Oct. 22, 2015

(65) Prior Publication Data

US 2016/0116140 A1   Apr. 28, 2016

(30) Foreign Application Priority Data

Oct. 24, 2014   (JP) .................. 2014-217754

(51) Int. Cl.
*H01L 33/50*   (2010.01)
*H01L 25/075*  (2006.01)
*H01L 33/62*   (2010.01)
*H01L 33/58*   (2010.01)

(52) U.S. Cl.
CPC ........ *H01L 33/504* (2013.01); *H01L 25/0753* (2013.01); *H01L 33/58* (2013.01);
(Continued)

(58) Field of Classification Search
CPC ....... H01L 33/52; H01L 33/507; H01L 33/62; H01L 33/504; H01L 2933/0066;
(Continued)

(56) References Cited

U.S. PATENT DOCUMENTS

2008/0054279 A1   3/2008  Hussell
2012/0292651 A1*  11/2012  You ...................... H01L 33/505
                                              257/98
(Continued)

FOREIGN PATENT DOCUMENTS

JP   2002076445   3/2002
JP   2003046141   2/2003
(Continued)

*Primary Examiner* — Thanh T Nguyen
(74) *Attorney, Agent, or Firm* — RatnerPrestia (57) ABSTRACT

A light-emitting apparatus that improves the use efficiency of emission light from light-emitting elements by an optical element for light collection and improves the light-emitting intensity in front of the apparatus without increasing the size of the apparatus, and its manufacturing method are provided. The light-emitting apparatus includes light-emitting elements, a substrate on which the light-emitting elements are mounted in a mounted region and a pair of electrodes for supplying power to the light-emitting elements is arranged around the mounted region, a sealing resin that contains a phosphor excited by emission light from the light-emitting elements and seals the light-emitting elements on the mounted region, and an optical element that is placed to cover the sealing resin with a lower end in contact with a flat region between the pair of electrodes and the sealing resin on the substrate and collects light emitted from the light-emitting elements through the sealing resin.

7 Claims, 12 Drawing Sheets

(52) U.S. Cl.
CPC .... *H01L 33/62* (2013.01); *H01L 2224/48091* (2013.01); *H01L 2224/48137* (2013.01)

(58) Field of Classification Search
CPC ........... H01L 2933/005; H01L 25/0753; H01L 2224/48091; H01L 2224/48137; H01L 2924/00014; H01L 33/58; F21V 13/04; F21V 5/04; F21V 7/04; F21V 23/06; F21V 19/002; F21K 9/50; F21K 9/90; F21Y 2101/02

See application file for complete search history.

(56) References Cited

U.S. PATENT DOCUMENTS

| | | | |
|---|---|---|---|
| 2013/0257266 A1* | 10/2013 | Ishizaki | H01L 33/504 313/503 |
| 2014/0028173 A1 | 1/2014 | Tsuchiya | |
| 2014/0119024 A1 | 5/2014 | Yu | |

FOREIGN PATENT DOCUMENTS

| | | |
|---|---|---|
| JP | 2003224307 | 8/2003 |
| JP | 2003234511 | 8/2003 |
| JP | 2004186488 | 7/2004 |
| JP | 2005167079 | 6/2005 |
| JP | 2008103688 | 5/2008 |
| JP | 2009289829 | 12/2009 |
| JP | 2012044048 | 3/2012 |
| JP | 2012074273 | 4/2012 |
| JP | 2013051369 | 3/2013 |
| JP | 2014041993 | 3/2014 |
| JP | 2014517527 | 7/2014 |

* cited by examiner

LIGHT-EMITTING APPARATUS WITH OPTICAL ELEMENT AND METHOD OF MANUFACTURING THE SAME

CROSS REFERENCE TO RELATED APPLICATION

This application is a new U.S. patent application that claims benefit of JP 2014-217754, filed on Oct. 24, 2014. The entire contents of JP 2014-217754 are hereby incorporated by reference.

TECHNICAL FIELD

The present invention relates to a light-emitting apparatus and a method of manufacturing the same.

BACKGROUND

A COB (Chip On Board) light-emitting apparatus in which a light-emitting element, such as an LED (light-emitting diode) element, is mounted on a universal substrate, such as a ceramic substrate and a metal substrate, is known. In such a light-emitting apparatus, for example, an LED element that emits blue light is sealed with a resin containing a phosphor and light obtained by exciting the phosphor with the light from the LED element is mixed, so that white light or the like is obtained depending on the intended use.

For example, Japanese Unexamined Patent Publication No. 2009-289829 describes a light-emitting apparatus having a circuit substrate, a reflective frame placed on the circuit substrate, a light-emitting element mounted on the circuit substrate, and a first light-emitting layer containing a phosphor that emits red light, a second light-emitting layer containing a phosphor that emits green light, and a third light-emitting layer containing a phosphor that emits blue light, which are laminated on a light-emitting surface of the light-emitting element.

In addition, Japanese Unexamined Patent Publication No. 2014-041993 describes a light-emitting apparatus in which a light-emitting element is mounted and sealed on a base material having a conductor layer connected to the outside on the surface thereof, the light-emitting apparatus including a phosphor layer arranged on the upper side of the light-emitting element and a resin layer that is in contact with both the phosphor layer and the conductor layer and has thermal conductive particles dispersed therein, thereby improving heat dissipation from phosphor particles.

In addition, at the time of manufacturing such a light-emitting apparatus, for example, in order to suppress variation in chromaticity, after the phosphor dispersed in the resin is precipitated, the resin is hardened. For example, Japanese Unexamined Patent Publication No. 2012-044048 describes a method of manufacturing a light-emitting element package including the steps of forming a liquid-repellent agent pattern on a substrate, mounting an LED chip on the inside of the liquid-repellent agent pattern on the substrate, applying a sealing resin in which a phosphor is kneaded on the inside of the liquid-repellent agent pattern, and precipitating the phosphor in the sealing resin in a calm state.

SUMMARY

For example, when a light-emitting apparatus is used as a light source for a spotlight, an optical element, such as a lens, is mounted on the light-emitting apparatus, and light from the light-emitting apparatus is collected. At this time, light collection into a desired range is possible if the lens can be made sufficiently large, but there is a limitation of the size of the luminaire in fact, and thus, the light needs to be collected in a narrower range without increasing the size of the light-emitting apparatus. For this purpose, a small-sized light-emitting apparatus may be achieved by mounting a plurality of light-emitting elements in higher density to narrow a region of a sealing resin corresponding to a light-emitting area (Light Emitting Surface) of the light-emitting apparatus as much as possible. However, in order to secure light-emitting efficiency, not only reducing the size of the apparatus simply but also ingenuity, such as reducing the amount of light loss when the optical element is mounted, is needed.

In addition, when the plurality of light-emitting elements are mounted in high density, the amount of generated heat is also increased with the mounting density and the light-emitting intensity may be decreased due to the heat, and thus, the heat releasing, performance also needs to be improved. In particular, a phosphor contained in the sealing resin also generates heat by irradiation of light from the light-emitting elements, and thus, as the mounting density of the light-emitting elements becomes higher, the need to release the heat from the phosphor is also increased.

Therefore, it is an object of the present invention to provide a light-emitting apparatus that improves the use efficiency of emission light from light-emitting elements by an optical element for light collection and improves the light-emitting intensity in front of the apparatus without increasing the size of the apparatus, and a method of manufacturing the same.

Provided is a light-emitting apparatus including a plurality of light-emitting elements, a substrate on which the plurality of light-emitting elements are mounted in a mounted region and a pair of electrodes for supplying power to the plurality of light-emitting elements is arranged around the mounted region, a sealing resin that contains a phosphor excited by emission light from the plurality of light-emitting elements and seals the plurality of light-emitting elements on the mounted region, and an optical element that is placed to cover the sealing resin with a lower end of the optical element in contact with a flat region between the pair of electrodes and the sealing resin on the substrate and collects light emitted from the plurality of light-emitting elements through the sealing resin.

Preferably, in the above light-emitting apparatus, the optical element is placed with a bottom surface in contact with the flat region on the substrate so as to house the sealing resin in a concave portion provided in the bottom surface, and has an inclined lateral surface that totally reflects light emitted laterally from the plurality of light-emitting elements through the sealing resin upward.

Preferably, in the above light-emitting apparatus, a connector is connected to the pair of electrodes, and the optical element is placed on a flat annular region between the connector and the sealing resin on the substrate.

Preferably, in the above light-emitting apparatus, the sealing resin contains a plurality of kinds of phosphors and is hardened in the state where the phosphors are precipitated in the layered form for every kind.

In addition, provided is a light-emitting apparatus including a light-emitting element, a sealing resin that seals the light-emitting element, contains a plurality of kinds of phosphors and is hardened in the state where the phosphors are precipitated in the layered form for every kind, and a substrate having an upper surface on which the light-emitting element is mounted, the substrate having a flat region surrounding the sealing resin.

Preferably, in the above light-emitting apparatus, the sealing resin contains a green phosphor and a red phosphor as the plurality of kinds of phosphors, and has a first layer that mainly contains the green phosphor, a second layer that mainly contains the red phosphor, and a third layer having lower concentrations of the green phosphor and the red phosphor than the first layer and the second layer, in this order from a side close to the substrate.

Preferably, the above light-emitting apparatus further includes an optical element that is placed to cover the sealing resin with a lower end of the optical element in contact with a flat region on the substrate and collects light emitted from the light-emitting element.

Preferably, in the above light-emitting apparatus, the light-emitting element is a plurality of LED elements, and a percentage of an area of the plurality of LED elements in the region on the upper surface of the substrate covered with the sealing resin is 30% to 50%.

In addition, provided is a method of manufacturing a light-emitting apparatus including the steps of mounting a plurality of light-emitting elements in a mounted region on a substrate, forming a pair of electrodes for supplying power to the plurality of light-emitting elements around the mounted region on the substrate, sealing the plurality of light-emitting elements on the mounted region with a sealing resin that contains a phosphor excited by emission light from the plurality of light-emitting elements, and placing an optical element to cover the sealing resin with a lower end of the optical element in contact with a flat region between the pair of electrodes and the sealing resin on the substrate, the optical element collecting light emitted from the plurality of light-emitting elements through the sealing resin.

Preferably, in the step of sealing, a sealing resin containing a plurality of kinds of phosphors is injected onto the mounted region, and the sealing resin is hardened after the phosphors are precipitated in the layered form for every kind.

In addition, provided is a method of manufacturing a light-emitting apparatus including the steps of mounting a light-emitting element on an upper surface of a substrate, sealing the light-emitting element with a sealing resin containing a plurality of kinds of phosphors so that a flat region surrounding the sealing resin is left on the upper surface of the substrate, precipitating the phosphors in the layered form for every kind, and hardening the sealing resin.

The above light-emitting apparatus and manufacturing method thereof can improve the use efficiency of emission light from light-emitting elements by an optical element for light collection, and improve the light-emitting intensity in front of the apparatus without increasing the size of the apparatus.

BRIEF DESCRIPTION OF THE DRAWINGS

Other features and advantages of the present invention will be apparent from the ensuing description, taken in conjunction with the accompanying drawings, in which:

FIG. 12A to FIG. 12C are schematic views for describing a manufacturing process of the light-emitting apparatus 1.

DESCRIPTION

Hereinafter, with reference to the drawings, a light-emitting apparatus and a manufacturing method thereof will be described. It should be noted that the technical scope of the present invention is not limited to embodiments of the invention, but covers the invention described in the claims and its equivalent.

Figure 1A:
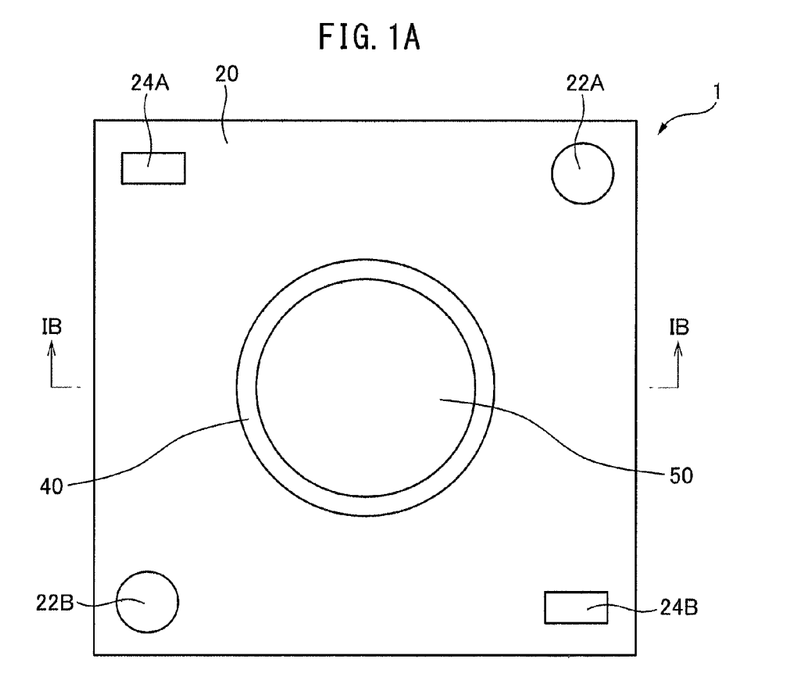
FIG. 1A and FIG. 1B are a top view and a cross-sectional view of a light-emitting apparatus 1.
Figure 1B:
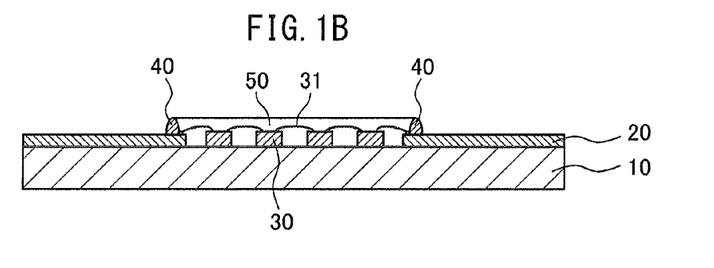

FIG. 1A and FIG. 1B are a top view and a cross-sectional view of a light-emitting apparatus 1. The light-emitting apparatus 1 has, as major components, a mounted substrate 10, a circuit substrate 20, LED elements 30, a reflective frame 40, and a sealing resin 50. FIG. 1A illustrates a top view of the light-emitting apparatus 1 as a finished product, and FIG. 1B illustrates a cross-sectional view taken along the line IB-IB of FIG. 1A.

Figure 2A:
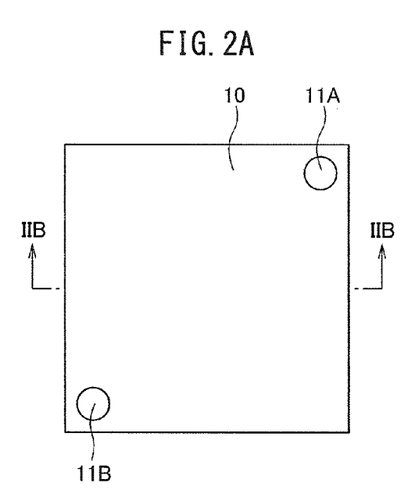
FIG. 2A to FIG. 2F are top views and cross-sectional views of the mounted substrate 10, the circuit substrate 20, and the reflective frame 40.
Figure 2B:
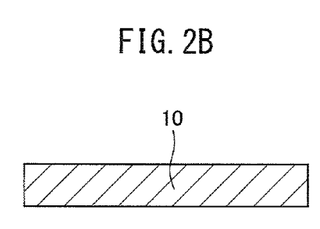
Figure 2C:
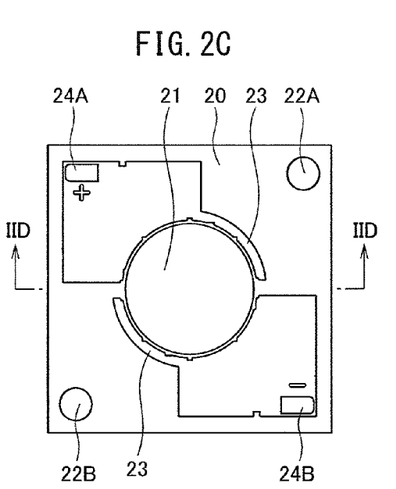
Figure 2D:
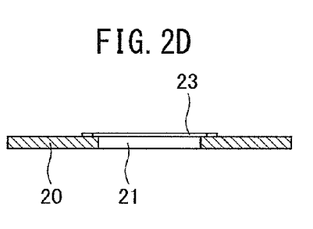
Figure 2E:
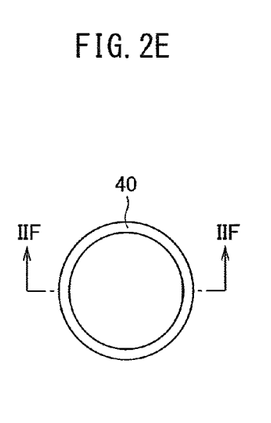
Figure 2F:
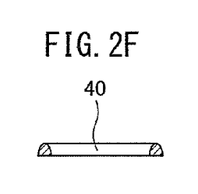

In addition, FIG. 2A to FIG. 2F are top views and cross-sectional views of the mounted substrate 10, the circuit substrate 20, and the reflective frame 40. Among these, FIG. 2A illustrates a top view of the mounted substrate 10, and FIG. 2B illustrates a cross-sectional view taken along the line IIB-IIB of FIG. 2A. FIG. 2C illustrates a top view of the circuit substrate 20, and FIG. 2D illustrates a cross-sectional view taken along the line IID-IID of FIG. 2C. FIG. 2E illustrates a top view of the reflective frame 40, and FIG. 2F illustrates a cross-sectional view taken along the line IIF-IIF of FIG. 2E.

The mounted substrate 10 is a substrate having a plane region on whose upper surface the LED elements 30 are mounted, and is composed of a metal member so as to increase a heat releasing property. The mounted substrate 10 is, for example, a metal substrate composed of an aluminum base which excels in a heat resistance property and a heat releasing property. The mounted substrate 10 has a square shape as an example, and fixing through holes 11A, 11B are provided near two apexes that are opposed to each other on the diagonal thereof.

The circuit substrate 20 has a square shape having the same size as the mounted substrate 10 as an example, and a circular opening 21 is formed in the central part thereof. Also in the circuit substrate 20, fixing through holes 22A, 22B are provided near two apexes that are opposed to each other on the diagonal. The lower surface of the circuit substrate 20 is attached and fixed on the mounted substrate 10 with an adhesive sheet, for example, such that the positions of the fixing through holes 22A, 22B are aligned with the fixing through holes 11A, 11B of the mounted substrate 10. In addition, a wiring pattern 23 is formed on the upper surface of the circuit substrate 20 so as to surround the opening 21. The wiring pattern 23 is not illustrated in FIG. 1A, and schematically illustrated in FIG. 2C and FIG. 2D. In the wiring pattern 23, a pair of connection electrodes 24A, 24B for supplying power to the LED elements 30 is formed near the other two apexes in which the fixing through holes 22A, 22B are not provided. One of the connection electrodes 24A, 24B is an anode electrode and the other is a cathode electrode, and these are connected to an external power supply and a voltage is applied, so that the light-emitting apparatus 1 emits light.

Each of the LED elements 30 is an example of a light-emitting element, and is, for example, a blue LED that emits blue light having a light-emission wavelength band of about 450 to 460 nm. In the light-emitting apparatus 1, a plurality of LED elements 30 are mounted on the mounted substrate 10 that is exposed in the opening 21 of the circuit substrate 20. The upper surface of the mounted substrate 10 that is exposed in the opening 21 is a mounted region of the LED elements 30. The lower surfaces of the LED elements 30 are fixed to the upper surface of the mounted substrate 10 with a transparent insulating adhesive agent, for example. In addition, each of the LED elements 30 has a pair of element electrodes on the upper surface thereof. As illustrated in FIG. 1B, the element electrodes of adjacent LED elements 30 are mutually connected by a bonding wire 31. Bonding wires 31 projected from LED elements 30 which are located on the outer periphery side of the opening 21 are connected to the wiring pattern 23 of the circuit substrate 20.

The reflective frame 40 is a circular frame body composed of a white resin in accordance with the size of the opening 21, and is fixed to the position overlapped with the wiring pattern 23 on the upper surface of the circuit substrate 20. The reflective frame 40 makes light emitted laterally from the LED elements 30 reflect toward the upper side of the light-emitting apparatus 1 (on the opposite side of the mounted substrate 10 viewed from the LED elements 30).

The sealing resin 50 is injected into the opening 21 to integrally coat and protect (seal) the plurality of LED elements 30. For example, as the sealing resin 50, a colorless transparent resin, such as an epoxy resin or a silicone resin, and in particular, a resin having a heat resistance property of about 250° C. may be used. The sealing resin 50 is hardened to be a disk shape in the example illustrated in FIG. 1A, and is fixed on the mounted substrate 10 by the reflective frame 40, for example.

In addition, as a plurality of kinds of phosphors, a green phosphor and a red phosphor are dispersedly mixed in the sealing resin 50. The light-emitting apparatus 1 emits white light obtained by mixing blue light from the LED elements 30 that are blue LEDs, and green light and red light obtained by exciting the green phosphor and the red phosphor with the blue light. The green phosphor is a granular phosphor material, such as $(BaSr)_2SiO_4:Eu^{2+}$, which absorbs the blue light emitted by the LED elements 30 and wavelength-converts the blue light into green light. The red phosphor is a granular phosphor material, such as $CaAlSiN_3:Eu^{2+}$, which absorbs the blue light emitted by the LED elements 30 and wavelength-converts the blue light into red light. The combination of the phosphors mixed in the sealing resin 50 is not limited to a green phosphor and a red phosphor, and a yellow phosphor, such as YAG (yttrium aluminum garnet), may be further mixed, or differently from the above, a combination of a yellow phosphor and a red phosphor may be used.

Figure 3:
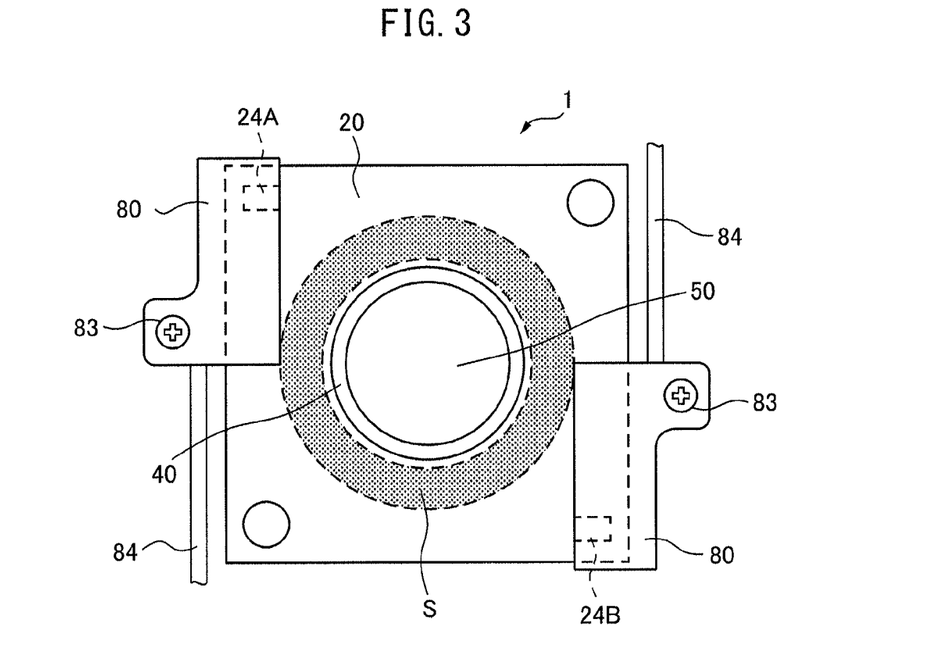
FIG. 3 is a top view of the light-emitting apparatus 1 to which a connector 80 is attached.

FIG. 3 is a top view of the light-emitting apparatus 1 to which a connector 80 is attached. As described above, in the light-emitting apparatus 1, the plurality of LED elements 30 are mounted in the mounted region covered with the sealing resin 50 (on the mounted substrate 10 in the opening 21), and the connection electrodes 24A, 24B are arranged around the mounted region. As illustrated in FIG. 3, the connector (holder) 80 for connecting the light-emitting apparatus 1 to the external power supply is connected to the connection electrodes 24A, 24B. A reference numeral 83 denotes screws for attaching the light-emitting apparatus 1 to a luminaire or the like through the connector 80, and a reference numeral 84 denotes electric wires 84 for connecting the light-emitting apparatus 1 to the external power supply. As illustrated in FIG. 3, the substrate of the light-emitting apparatus 1 composed of the mounted substrate 10 and the circuit substrate 20 has a flat region surrounding the sealing resin 50 between the connector 80 and the sealing resin 50. In the flat region, an annular region surrounding the sealing resin 50 is denoted by a reference symbol S in FIG. 3.

Figure 4A:
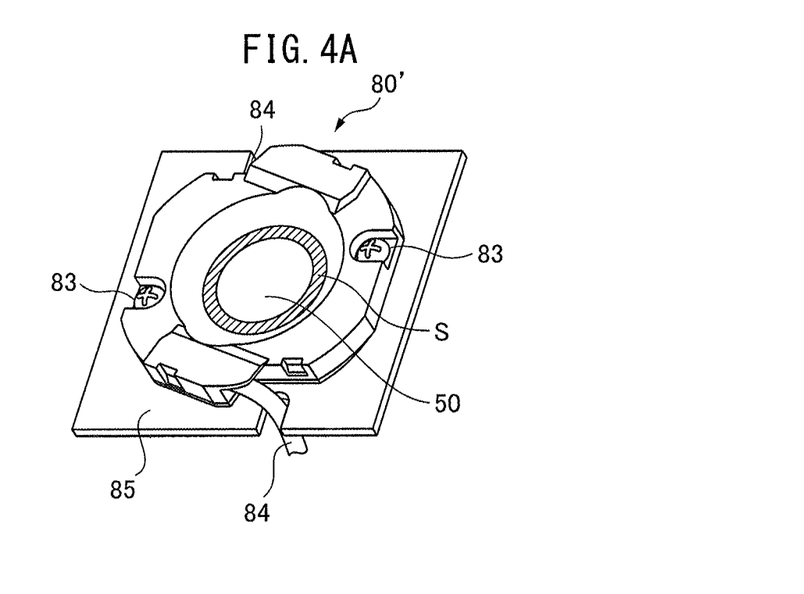
FIG. 4A and FIG. 4B are perspective views of the light-emitting apparatus 1 to which another connector 80' is attached.
Figure 4B:
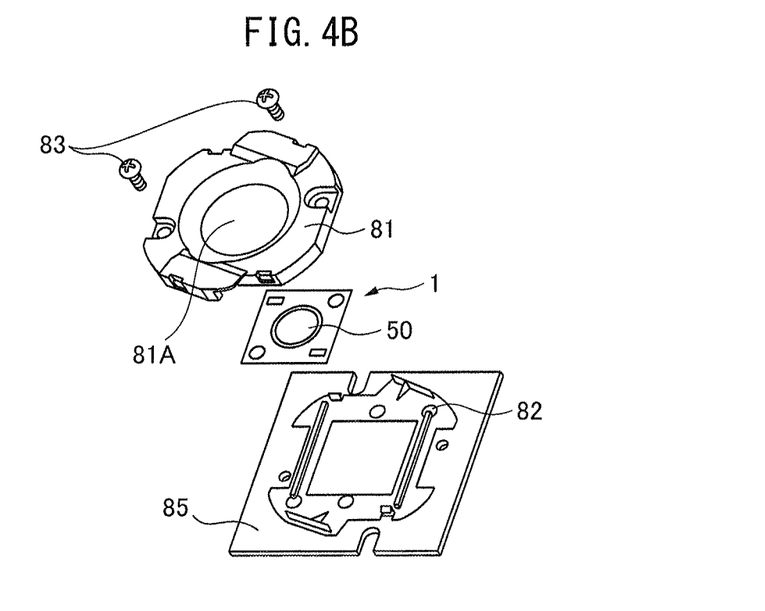

FIG. 4A and FIG. 4B are perspective views of the light-emitting apparatus 1 to which another connector 80' is attached. In particular, FIG. 4B is an exploded perspective view of FIG. 4A.

The connector 80' is composed of an upper cover 81 having a circular opening 81A in the center thereof, and a lower cover 82. For example, the lower cover 82 is fixed on a heatsink 85 for heat releasing, and the upper cover 81 is fixed on the heatsink 85 by screws 83 while sandwiching the light-emitting apparatus 1 with the lower cover 82 such that the sealing resin 50 is arranged in the opening 81A. The reference numeral 84 denotes electric wires 84 that are connected to the connection electrodes 24A, 24B to connect the light-emitting apparatus 1 to the external power supply. When the connector 80' is attached, the light-emitting apparatus 1 also has a flat annular region S surrounding the sealing resin 50 between the connector 80' and the sealing resin 50 on the circuit substrate 20.

Figure 5:
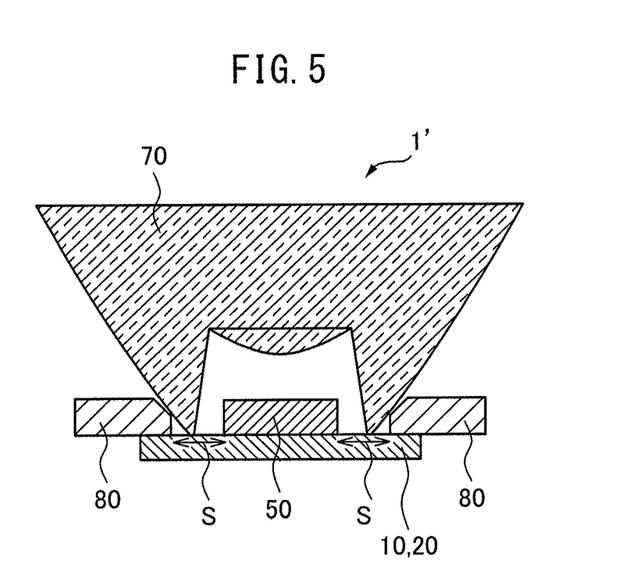
FIG. 5 is a vertical cross-sectional view of a light-emitting apparatus 1' in which a lens 70 is attached on the annular region S of the light-emitting apparatus 1.
Figure 8A:
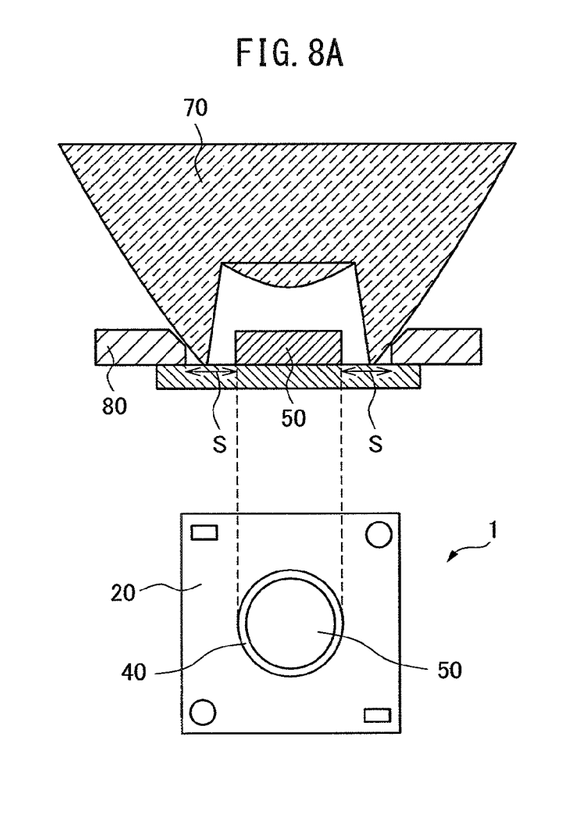
FIG. 8A and FIG. 8B are views for comparing the light-emitting apparatus 1 and a light-emitting apparatus 100 having different sizes of light-emitting areas.
Figure 8B:
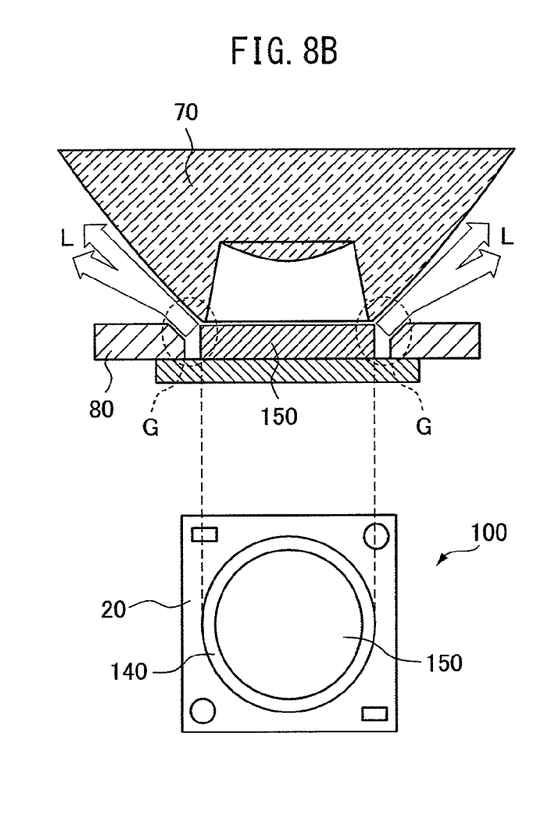

FIG. 5 is a vertical cross-sectional view of a light-emitting apparatus 1' in which a lens 70 is attached on the annular region S of the light-emitting apparatus 1. In FIG. 5, and FIG. 8A and FIG. 8B described below, parts which have nothing to do with the description are simplified, and, for example, the opening 21 and the reflective frame 40 are not illustrated in the drawings. The lens 70 is an example of an optical element that collects light emitted from the light-emitting elements, and is placed on the annular region S between the connector 80 and the sealing resin 50 to cover the sealing resin 50 with the lower end of the lens 70 in contact with the annular region S.

As illustrated in FIG. 5, in the light-emitting apparatus 1, the flat annular region S is provided between the connection electrodes 24A, 24B (the connector 80) and the sealing resin 50 (the reflective frame 40) on the upper surface of the circuit substrate 20, and thus, space to fix the lens 70 on the substrate is secured. If the region of the sealing resin 50 is expanded and the lens 70 is arranged on the sealing resin 50, for example, the bonding wires 31 (refer to FIG. 1B) may be broken. However, in the light-emitting apparatus 1, the lens 70 can be directly fixed on the flat annular region S, and thus, the possibility of such a problem occurring is reduced.

Figure 6:
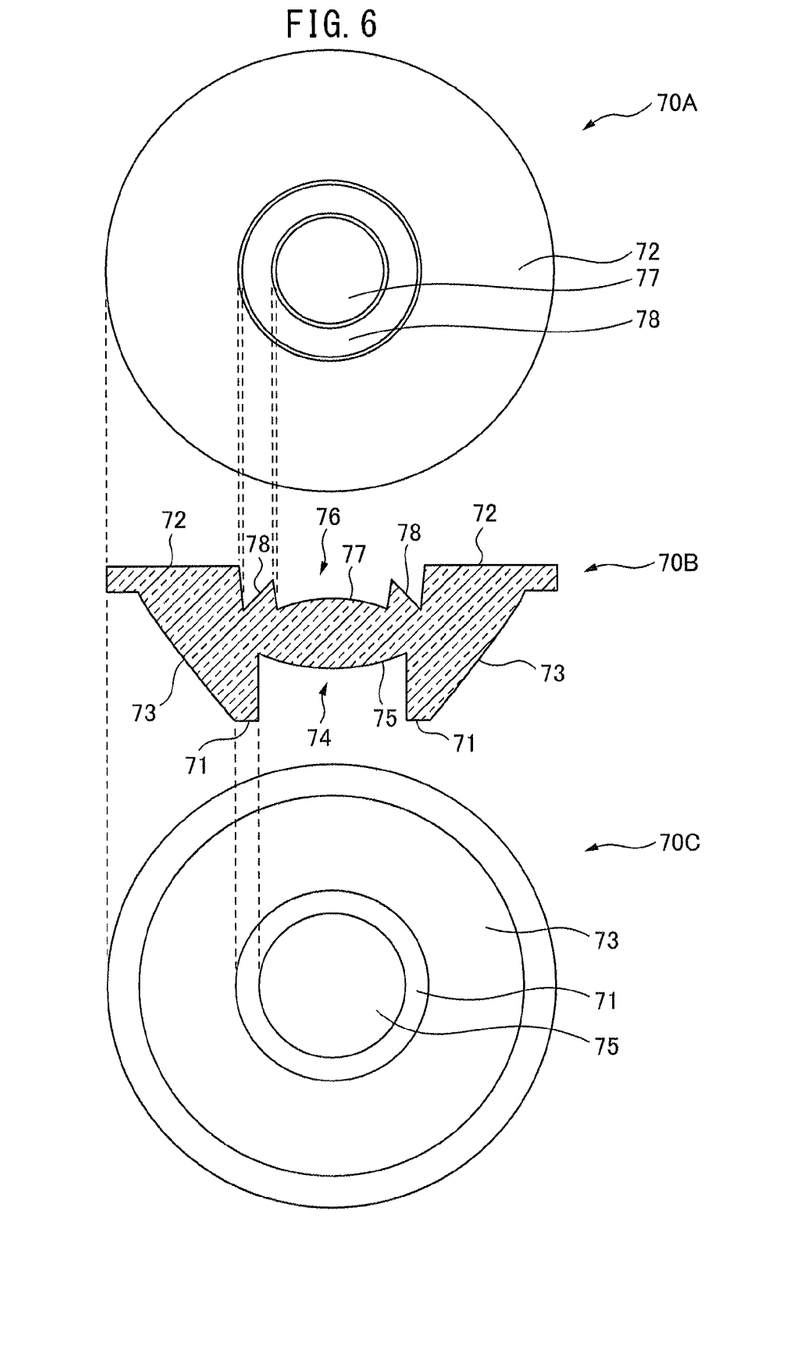
FIG. 6 is a view illustrating the shape of the lens 70.

FIG. 6 is a view illustrating the shape of the lens 70. Reference numerals 70A to 70C respectively indicate a top view, an end view, and a bottom view of the lens 70. The end view of the reference numeral 70B illustrates an end surface obtained by cutting the lens 70 in the vertical direction so as to pass through the center in the horizontal direction.

The lens 70 has a rotationally symmetric shape with an axis passing through the center of the lens 70 in the vertical direction as a symmetrical axis, and has a circular bottom surface 71, a circular upper surface 72 larger than the bottom surface 71, and an inclined lateral surface 73. A circular lower concave portion 74 in which the sealing resin 50 is to be housed is formed in the center of the bottom surface 71, and a lower curved surface 75 that protrudes downward is formed on the upper end of the lower concave portion 74. An upper concave portion 76 whose width in the horizontal direction is slightly larger and whose depth in the vertical direction is slightly smaller than the lower concave portion 74 is formed in the center of the upper surface 72, and an upper curved surface 77 that protrudes upward is formed on the lower end of the upper concave portion 76. In addition, an annular convex portion 78 whose vertical section is a triangular shape is formed on the outer periphery in the upper concave portion 76, and the upper curved surface 77 is formed on the bottom surface of the upper concave portion 76 inside the annular convex portion 78.

Figure 7:
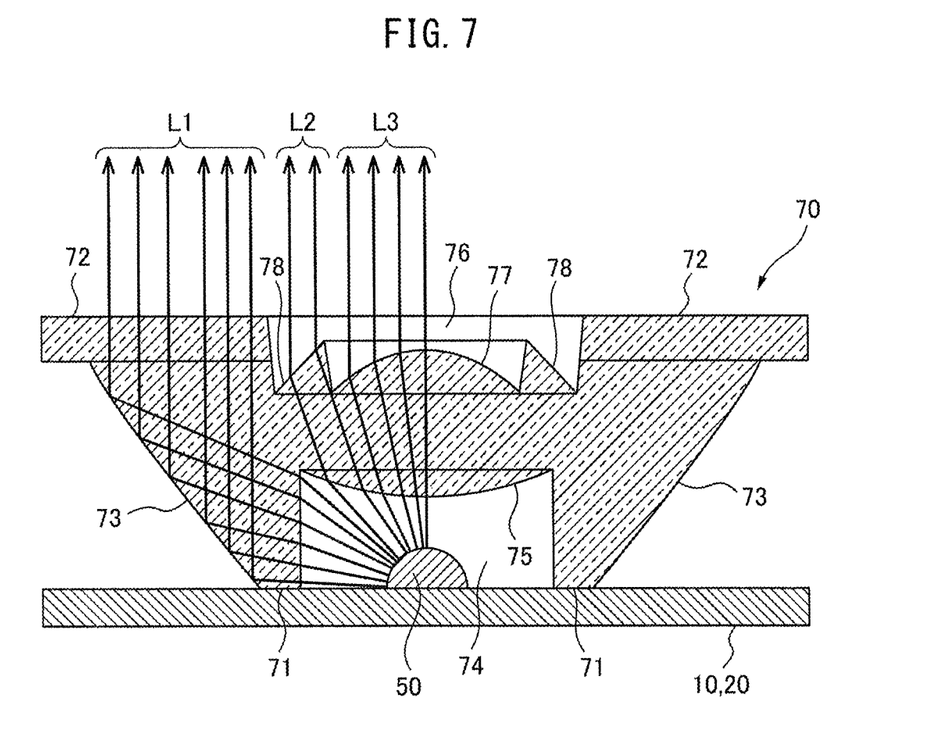
FIG. 7 is a cross-sectional view for describing the function of the lens 70.

FIG. 7 is a cross-sectional view for describing the function of the lens 70. The lens 70 is placed on the circuit substrate 20 such that the sealing resin 50 is housed in the lower concave portion 74 with the bottom surface 71, which is the lower end, in contact with the annular region S. As indicated by an arrow of a reference symbol L1, light emitted laterally or obliquely upward from the LED elements 30 through the sealing resin 50 is incident on the lens 70 from the lower concave portion 74, and then, is totally reflected upward by the lateral surface 73, and is emitted vertically upward from the upper surface 72. As indicated by an arrow of a reference symbol L2, light emitted obliquely upward toward the end portion of the lower curved surface 75 from the LED elements 30 is refracted on the lower curved surface 75 and incident on the lens 70, is refracted again on the upper surface of the annular convex portion 78, and is emitted vertically upward from the upper concave portion 76. As indicated by an arrow of a reference symbol L3, light emitted approximately vertically upward from the LED elements 30 is refracted on the lower curved surface 75 and incident on the lens 70, is refracted again on the upper curved surface 77, and is emitted vertically upward from the upper concave portion 76. Although the light from the LED elements 30 is emitted both laterally and upward, the light passes through the lens 70 in this manner, and thus, is collected vertically upward.

FIG. 8A and FIG. 8B are views for comparing the light-emitting apparatus 1 and a light-emitting apparatus 100 having different sizes of light-emitting areas. FIG. 8A illustrates a top view of the light-emitting apparatus 1 and a vertical cross-sectional view of the light-emitting apparatus 1 to which the lens 70 is attached, as is the case with FIG. 3 and FIG. 5. On the other hand, FIG. 8B illustrates a top view of the light-emitting apparatus 100 in which LED elements are sealed by a sealing resin 150 having a larger area than the sealing resin 50 of the light-emitting apparatus 1, and a vertical cross-sectional view of the light-emitting apparatus 100 to which the lens 70 is attached. The light-emitting apparatus 100 differs from the light-emitting apparatus 1 in the size of a reflective frame 140, the area of the sealing resin 150, and the interval between the sealed LED elements, but has the same configuration as the light-emitting apparatus 1 in other respects.

In the light-emitting apparatus 100, since the area of the sealing resin 150 corresponding to the light-emitting area (Light Emitting Surface) is large, the lens 70 cannot be directly placed on the substrate when the connector 80 is attached to the connection electrode. Thus, as illustrated in FIG. 8B, in the light-emitting apparatus 100, the lens 70 is arranged on the sealing resin 150. Due to this, in the light-emitting apparatus 100, as indicated by an arrow L, a part of light escapes outside from a part indicated by a dashed line G on the lateral side of the sealing resin 150, which results in light loss.

On the other hand, in the light-emitting apparatus 1, since the lens 70 can be directly placed on the annular region S on the upper surface of the circuit substrate 20, the lens 70 can be placed closer to the LED elements 30 compared to the case of the light-emitting apparatus 100. Thus, the light from the LED elements 30 is reliably incident on the lens 70 without escaping laterally. Therefore, when conditions, such as the number of the LED elements 30, the size of the lens, and a driving voltage, are the same, the light-emitting apparatus 1 can focus the light in the front direction of the apparatus and improve the light-emitting intensity in front of the apparatus, compared to the light-emitting apparatus 100.

Figure 9:
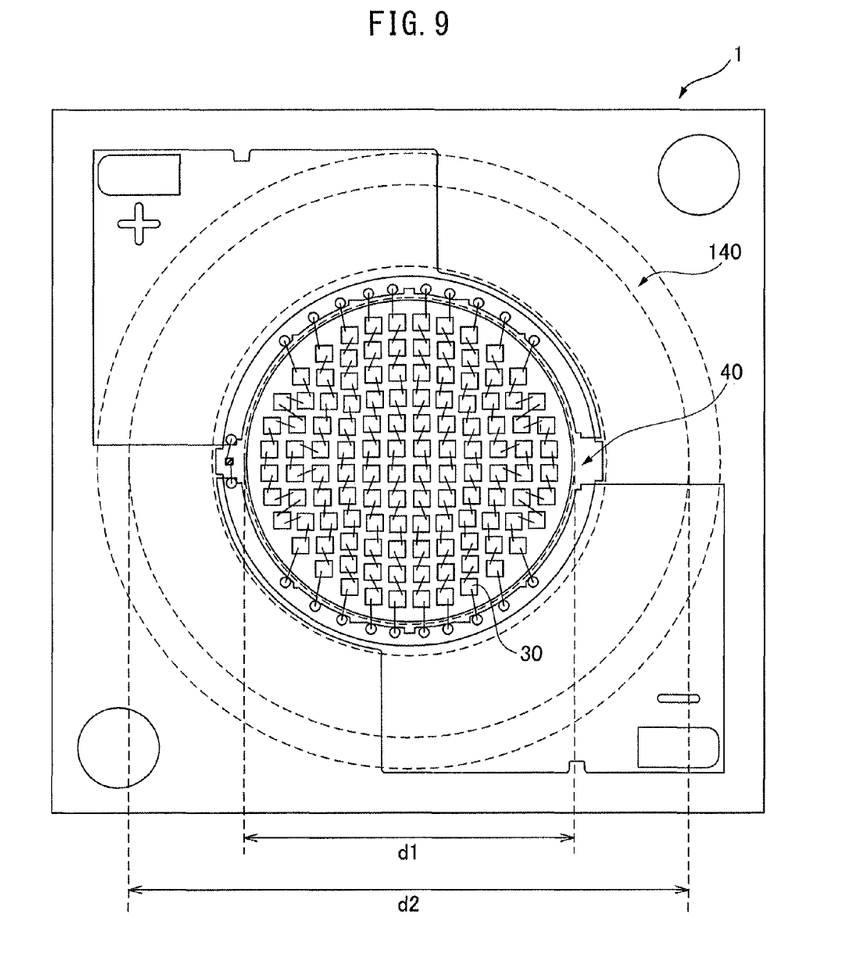
FIG. 9 is a top view illustrating an arrangement example of the LED elements 30 of the light-emitting apparatus 1.

FIG. 9 is a top view illustrating an arrangement example of the LED elements 30 of the light-emitting apparatus 1. FIG. 9 illustrates an arrangement example of the plurality of LED elements 30 which are not illustrated in the drawings, such as FIG. 1A, because of covered with the sealing resin 50, and also illustrates the positions of the reflective frame 40 of the light-emitting apparatus 1 and the reflective frame 140 of the light-emitting apparatus 100 for comparison. Reference symbols d1, d2 are the diameters of the light-emitting areas of the light-emitting apparatus 1 and the light-emitting apparatus 100, respectively. The distance between the outermost LED element 30 and the reflective frame 40 is comparable in the light-emitting apparatus 1 and the light-emitting apparatus 100 in consideration of displacement of the substrate at the time of manufacturing, but the interval between the LED elements of the light-emitting apparatus 1 is narrower because the LED elements 30 are packed into a narrower light-emitting area. When the interval between the LED elements is narrowed, light emitted from a certain LED element is absorbed by an adjacent LED element, thereby bringing a disadvantage in terms of the light-emitting efficiency, but the number of mounted LED elements needs not to be decreased even when the light-emitting area is narrow, and thus, the light-emitting intensity (illuminance) can be secured. In addition, when the interval between the LED elements is narrowed, there is also an advantage in that the possibility of breakage of the bonding wires 31 (refer to FIG. 1B) connecting the LED elements to each other is reduced.

In the light-emitting apparatus 1, the percentage of the area of the plurality of LED elements 30 in a region (light-emitting area) on the upper surface of the substrate, which is covered with the sealing resin 50, is generally about 30 to 50%. In contrast, the percentage of the area of the LED elements 30 in the light-emitting area of the light-emitting apparatus 100 is generally about 10 to 20% if the number of the elements is the same as that of the light-emitting apparatus 1. In order to focus the light in the front direction of the apparatus, the LED elements 30 are preferably mounted such that the percentage of the area of all the LED elements to the area of the entire light-emitting area (filling rate) is 30% or more, for example. On the other hand, there is a problem in that mounting becomes difficult in practice when the filling rate becomes too high, and thus, the filling rate is preferably 50% or less, for example. The filling rate can be further increased when the light-emitting area is configured by using one semiconductor crystal that is not cut, but the yield becomes worse in this case, and thus, individual pieces are preferably used as the LED elements 30.

Next, a layer structure of the phosphors in the sealing resin 50 will be described. In the light-emitting apparatus 1, by increasing the filling rate of the LED elements 30 compared to the light-emitting apparatus 100, the amount of generated heat per unit area of the light-emitting area is also increased. In particular, when the interval between the LED elements is narrowed and the density of the light is increased, the density of the light that illuminates the phosphors contained in the sealing resin 50 is also increased, and the phosphors themselves generate heat. Therefore, in the light-emitting apparatus 1, the phosphors in the sealing resin 50 are precipitated close to the mounted substrate 10, and thus, the heat releasing property of the phosphors themselves is also improved to facilitate heat dissipation.

Figure 10:
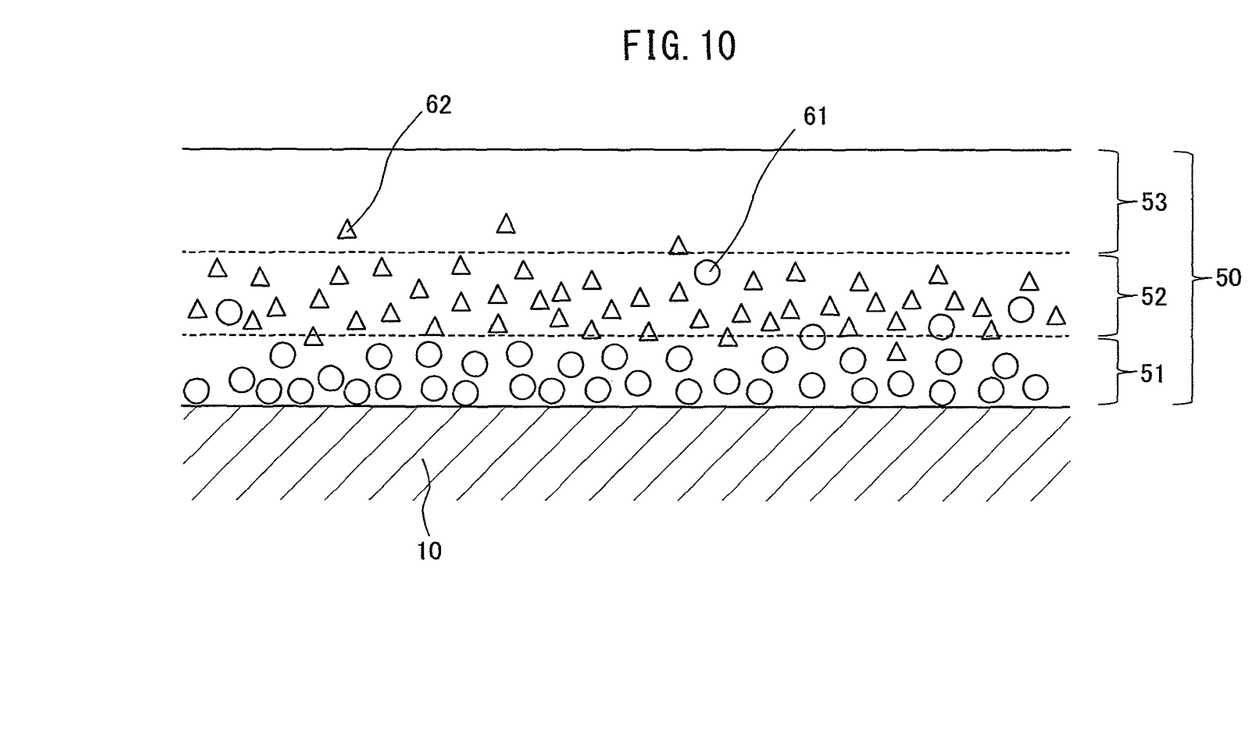
FIG. 10 is a schematic cross-sectional view of the sealing resin 50.

FIG. 10 is a schematic cross-sectional view of the sealing resin 50. As described above, the sealing resin 50 contains a green phosphor 61 and a red phosphor 62 as a plurality of kinds of phosphors. Between these, the green phosphor 61 is larger in particle diameter and weight compared to the red phosphor 62. Therefore, at the time of manufacturing the light-emitting apparatus 1, by precipitating the green phosphor 61 and the red phosphor 62 when the sealing resin 50 is not hardened, a layer that contains a high proportion of the green phosphor 61, a layer that contains a high proportion of the red phosphor 62, and a resin layer that contains almost no phosphors are formed in the sealing resin 50 due to the difference in specific gravity between both phosphors. In other words, the sealing resin 50 has a first layer 51 that mainly contains the green phosphor 61, a second layer 52 that mainly contains the red phosphor 62, and a third layer 53 having lower concentrations of the green phosphor 61 and the red phosphor 62 than the first layer 51 and the second layer 52, in this order from the side close to the mounted substrate 10.

For example, while the thermal conductivity of a silicone resin is about 0.1 to 0.4 W/mK, the thermal conductivity of a phosphor is about 9 to 14 W/mK that is significantly higher than that of a silicone resin. In addition, among the phosphors, a green phosphor is higher in thermal conductivity than a red phosphor. Therefore, the first layer 51, the second layer 52, and the third layer 53 are formed in this order from the side close to the mounted substrate 10, so that, in the sealing resin 50, the thermal conductivity becomes higher as getting closer to the mounted substrate 10. Thus, compared to the case of not having the foregoing multi-layered structure, in the light-emitting apparatus 1, heat can be transferred to the mounted substrate 10 more efficiently from the entire region of the sealing resin 50. Moreover, since the material of the mounted substrate 10 is aluminum which excels in a heat releasing property, in the light-emitting apparatus 1, sufficient heat release is possible even if the filling rate of the LED elements 30 is increased.

Figure 11:
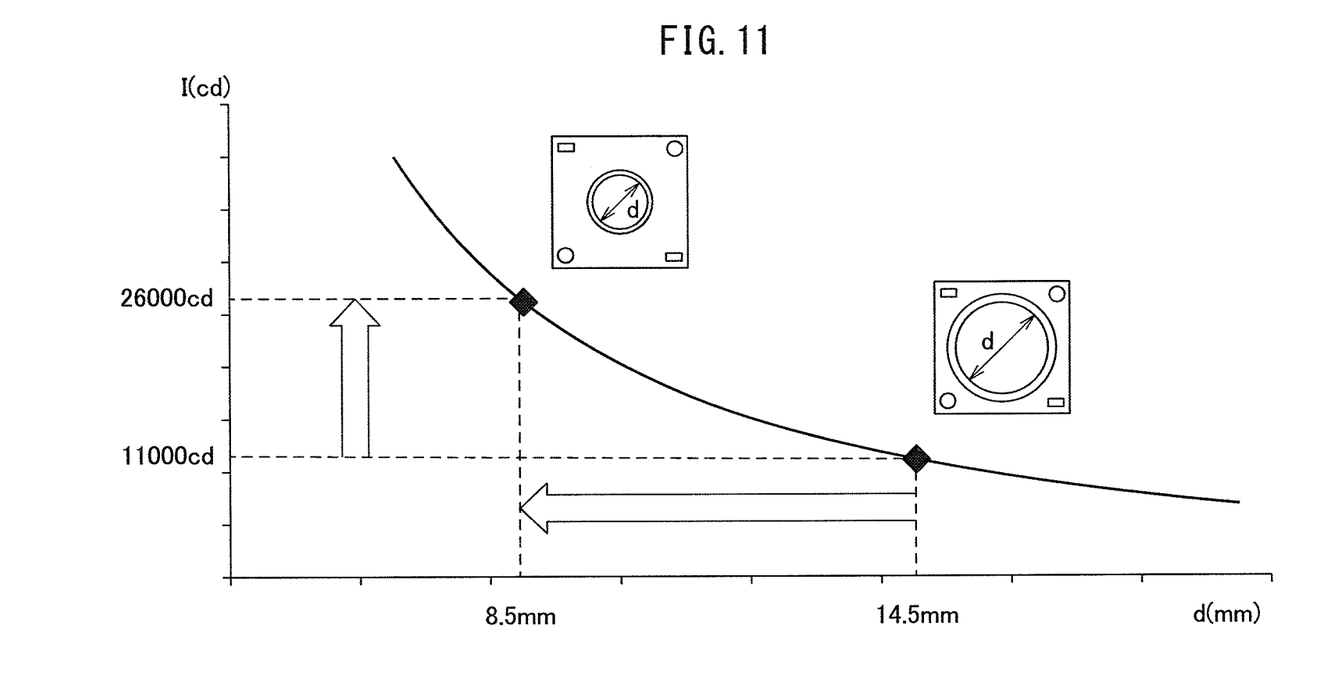
FIG. 11 is a graph illustrating a relationship between the size of the light-emitting area and the light-emitting intensity.

FIG. 11 is a graph illustrating a relationship between the size of the light-emitting area and the light-emitting intensity. In the graph, the horizontal axis indicates the diameter d (mm) of the circular light-emitting area, and the vertical axis indicates the light-emitting intensity I (cd) from the light-emitting area. For example, light-emitting apparatuses having the diameters of the light-emitting areas of 8.5 mm and 14.5 mm correspond to the above-described light-emitting apparatuses 1, 100, respectively. When it is assumed that the number of the elements in the light-emitting area is the same, as indicated by an arrow in the graph, the light-emitting intensity becomes higher as the light-emitting area becomes smaller. By not only reducing the light-emitting area and narrowing the interval between the LED elements but also precipitating the phosphors in the sealing resin 50 as described using FIG. 10, the light-emitting intensity is improved by a few percent.

Figure 12A:
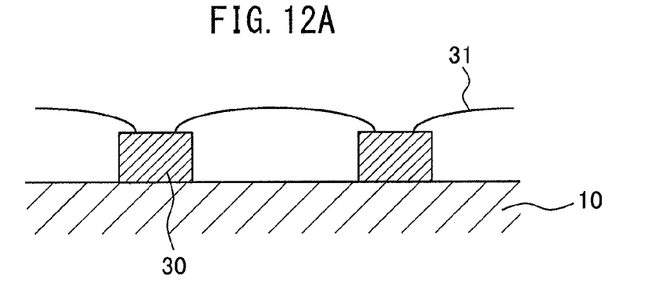
Figure 12B:
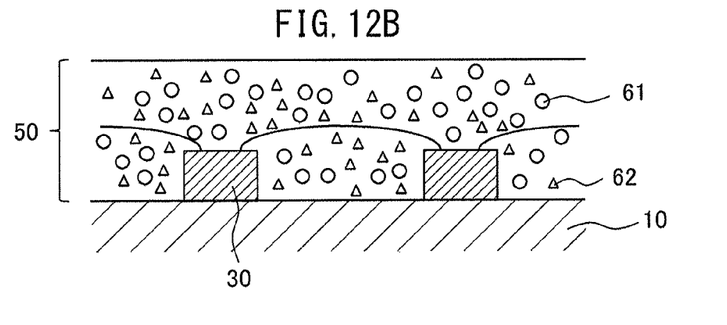

FIG. 12A to FIG. 12C are schematic views for describing a manufacturing process of the light-emitting apparatus 1. At the time of manufacturing the light-emitting apparatus 1, firstly, the mounted substrate 10, the circuit substrate 20, and the reflective frame 40 illustrated in FIG. 2A to FIG. 2F are prepared, they are bonded together, and the LED elements 30 are mounted on the upper surface of the mounted substrate 10 in the opening 21 of the circuit substrate 20 as illustrated in FIG. 12A. In addition, the pair of connection electrodes 24A, 24B for supplying power to the LED elements 30 is formed around the opening 21 of the circuit substrate 20 in advance.

Subsequently, as illustrated in FIG. 12B, the sealing resin 50 containing the green phosphor 61 and the red phosphor 62 is injected into the opening 21 to seal the LED elements 30. At this time, the sealing resin 50 is not hardened yet, and the green phosphor 61 and the red phosphor 62 are dispersed in the layer of the sealing resin 50. The flat annular region S surrounding the sealing resin 50 (refer to FIG. 3) is left on the upper surface of the circuit substrate 20 such that the lens can be fixed.

Then, in the state illustrated in FIG. 12B, sufficient time for the green phosphor 61 and the red phosphor 62 to be precipitated by their own weight, for example, 12 hours, is waited while keeping the mounted substrate 10 in a horizontal position and keeping the environmental temperature at a temperature at which the sealing resin 50 is not hardened. Accordingly, as illustrated in FIG. 12C, the first layer 51 that contains a high proportion of the green phosphor 61, the second layer 52 that contains a high proportion of the red phosphor 62, and the third layer 53 that contains almost no phosphors are laminated in this order from the side close to the mounted substrate 10. In other words, the phosphors are precipitated in the layered form for every kind. After that, by hardening the sealing resin 50 by heating, for example, the light-emitting apparatus 1 as a finished product is obtained.

Furthermore, the connector 80 is connected to the connection electrodes 24A, 24B of the light-emitting apparatus 1, and the lens 70 that collects the light emitted from the LED elements 30 through the sealing resin 50 is placed on the circuit substrate 20. In this case, as illustrated in FIG. 5, the lens 70 is placed to cover the sealing resin 50 with the lower end thereof (the bottom surface 71) in contact with the flat annular region S between the connection electrodes 24A, 24B (the connector 80) and the sealing resin 50 on the circuit substrate 20. Accordingly, the light-emitting apparatus 1' with the lens 70 is obtained.

As described above, in the light-emitting apparatus 1, by securing the flat annular region S for placing the lens 70 on the upper surface of the circuit substrate 20 and narrowing the light-emitting area by the annular region S, the light can be focused in the front direction of the apparatus, and the use efficiency of the light when using the lens can be improved. In addition, in the light-emitting apparatus 1, by hardening the sealing resin 50 in the state where the green phosphor 61 and the red phosphor 62 are precipitated in the layered form for every kind in the sealing resin 50, the heat generated by light emission can be efficiently released, and thereby the light-emitting intensity can be improved.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting apparatus comprising:
    a plurality of light-emitting elements;
    a substrate on which the plurality of light-emitting elements are mounted in a mounted region and a pair of electrodes for supplying power to the plurality of light-emitting elements is arranged around the mounted region;
    a sealing resin that contains a phosphor excited by emission light from the plurality of light-emitting elements and seals the plurality of light-emitting elements on the mounted region; and
    an optical element that is placed to cover the sealing resin and collects light emitted from the plurality of light-emitting elements through the sealing resin,
    wherein the optical element comprises:
        a bottom surface in contact with a flat region on the substrate between the pair of electrodes and the sealing resin, the bottom surface being provided with a lower concave portion in which the sealing resin is housed;
        a lateral surface inclined so as that the optical element becomes wider toward an upper end thereof, wherein the lateral surface totally reflects light emitted laterally from the plurality of light-emitting elements through the sealing resin vertically upward; and
        an upper surface that is larger than the bottom surface and includes an upper curved surface on which light emitted obliquely upward from the plurality of light-emitting elements through the sealing resin is refracted vertically upward.

2. The light-emitting apparatus according to claim 1, wherein
    a connector is connected to the pair of electrodes, and
    the optical element is placed on a flat annular region between the connector and the sealing resin on the substrate.

3. The light-emitting apparatus according to claim 1, wherein the sealing resin contains a plurality of kinds of phosphors and is hardened in the state where the phosphors are precipitated in the layered form for every kind.

4. The light-emitting apparatus according to claim 3, wherein the sealing resin contains a green phosphor and a red phosphor as the plurality of kinds of phosphors, and has a first layer that mainly contains the green phosphor, a second layer that mainly contains the red phosphor, and a third layer having lower concentrations of the green phosphor and the red phosphor than the first layer and the second layer, in this order from a side close to the substrate.

5. The light-emitting apparatus according to claim 1, wherein
    the plurality of light-emitting elements are a plurality of LED elements, and
    a percentage of an area of the plurality of LED elements in the mounted region covered with the sealing resin is 30% to 50%.

6. The light-emitting apparatus according to claim 1, wherein a lower curved surface that protrudes downward is formed on an upper end of the lower concave portion of the optical element.

7. The light-emitting apparatus according to claim 1, wherein
    an upper concave portion is provided on the upper surface of the optical element; and
    the upper curved surface is formed on a lower end of the upper concave portion.

* * * * *